US007923816B2

(12) United States Patent
Inoue et al.

(10) Patent No.: US 7,923,816 B2
(45) Date of Patent: Apr. 12, 2011

(54) SEMICONDUCTOR DEVICE HAVING CAPACITOR ELEMENT

(75) Inventors: Ken Inoue, Kanagawa (JP); Tomoko Inoue, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 95 days.

(21) Appl. No.: 12/325,294

(22) Filed: Dec. 1, 2008

(65) Prior Publication Data

US 2009/0140386 A1 Jun. 4, 2009

(30) Foreign Application Priority Data

Nov. 29, 2007 (JP) ................................ 2007-309058

(51) Int. Cl.
*H01L 29/92* (2006.01)
(52) U.S. Cl. .. 257/532; 257/295; 257/306; 257/E29.343
(58) Field of Classification Search .................... 257/40, 257/295, 306, 310, 532, E27, E29.343; 438/3, 438/82, 99, 240, 253, 396, 957
See application file for complete search history.

(56) References Cited

U.S. PATENT DOCUMENTS

| | | | |
|---|---|---|---|
| 6,921,475 | B2 | 7/2005 | Kuhr et al. |
| 2001/0018237 | A1* | 8/2001 | Hartner et al. ................ 438/142 |
| 2005/0064605 | A1* | 3/2005 | Lee et al. ........................... 438/3 |
| 2006/0054948 | A1* | 3/2006 | Yamada ........................ 257/295 |
| 2006/0108621 | A1* | 5/2006 | Hayashi et al. ............... 257/295 |
| 2006/0197135 | A1 | 9/2006 | Inoue |
| 2007/0096189 | A1* | 5/2007 | Iwasaki et al. ................ 257/306 |
| 2007/0152368 | A1* | 7/2007 | Choi et al. ............... 264/211.23 |

FOREIGN PATENT DOCUMENTS

| | | |
|---|---|---|
| CN | 1391283 | 1/2003 |
| CN | 1914688 | 2/2007 |
| JP | 2002-373945 | 12/2002 |
| JP | 2003-007854 | 1/2003 |
| JP | 2003-332463 | 11/2003 |
| JP | 2004-235560 | 8/2004 |
| JP | 2006-245364 | 9/2006 |
| WO | WO 01/52266 | 1/2001 |
| WO | WO 03/052827 | 6/2003 |

OTHER PUBLICATIONS

R. Venkatesan et al., "Tapping ZettaRAM™ for Low-Power Memory Systems", Preceedings of the 11$^{th}$ Int'l Symp0osium on High-Performance Computer Architecture (HPCA-11 2005).
Chinese Patent Office issued a Chinese Office Action dated Mar. 15, 2010, Application No. 200810178821.9.

* cited by examiner

*Primary Examiner* — Victor Mandala
*Assistant Examiner* — Whitney Moore
(74) *Attorney, Agent, or Firm* — Young & Thompson (57) ABSTRACT

Provided is a semiconductor device which includes a capacitor element having a flat-plate-type lower electrode provided over a semiconductor substrate, a flat-plate-type TiN film provided over the lower electrode in parallel therewith, and a capacitor film provided between the lower electrode and the TiN film; and a first Cu plug brought into contact with the bottom surface of the lower electrode, and is composed of a metal material, wherein the capacitor film has a film which contains an organic molecule as a constituent.

13 Claims, 13 Drawing Sheets

SEMICONDUCTOR DEVICE HAVING CAPACITOR ELEMENT

This application is based on Japanese patent application No. 2007-309058 the content of which is incorporated hereinto by reference.

BACKGROUND

1. Technical Field

The present invention relates to a semiconductor device, and in particular to a semiconductor device provided with a capacitor element.

2. Related Art

In recent years, semiconductor devices having capacitor elements, such as DRAM, have been advancing towards larger capacity and finer dimension of the elements. There has, therefore, been a demand for the capacitor element to ensure large capacity despite small area.

In particular, logic-embedded semiconductor memory devices having a logic section and a memory section provided on the same substrate have been desired to be improved in the operation speed.

Known technologies relevant to the semiconductor devices having capacitor elements include those described in patent documents and by Ravi K. Venkatesan et al., below.

Japanese Laid-Open Patent Publication No. 2003-7854 describes a logic-embedded semiconductor memory device based on a COB (capacitor over bit line) structure containing cylinder-type MIM (Metal Insulator Metal) capacitors. In the cylinder-type MIM capacitor, a lower electrode is formed so as to cover the entire inner wall of a recess formed in an insulating interlayer.

Japanese Laid-Open Patent Publication No. 2006-245364 describes a semiconductor device based on a CUB (capacitor under bit line) structure containing cylinder-type MIM capacitors.

Japanese Laid-Open Patent Publication Nos. 2003-332463 and 2004-235560 describe semiconductor devices based on the CUB structure having parallel flat plate type (planar) MIM capacitors. The semiconductor memory devices based on the CUB structure raise a problem in that any attempt of shrinking the memory cell area may more readily cause short-circuiting between the capacitor elements and bit contact plugs.

Japanese Laid-Open Patent Publication No. 2002-373945 describes an MIM capacitor using a metal oxide film as the capacitor insulating film.

Published Japanese Translation of PCT International Publication for Patent Application No. 2003-520384 describes a technique relevant to a non-volatile memory using an electro-conductive organic film.

Domestic Re-Publication of PCT International Publication for Patent Application No. WO2003-052827 describes a technique relevant to a memory cell using a polymer composed of monomer units containing a sandwich-type coordination compound Ravi K. Venkatesan et al. ("Tapping ZettaRAM™ for Low-Power Memory Systems", Proceedings of the 11th Int'l Symposium on High-Performance Computer Architecture (HPCA-11 2005), 2005) describes a technique relevant to a memory cell using a self-assembled single molecular film.

U.S. Pat. No. 6,921,475 describes a technique relevant to electrochemical measurement of a self-assembled single molecular film coupled to a sensor.

Published Japanese Translation of PCT International Publication for Patent Application No. 2003-520384, Domestic Re-Publication of PCT International Publication for Patent Application No. WO2003-052827, U.S. Pat. No. 6,921,475 and Ravi K. Venkatesan et al. have described the capacitors using the organic molecule films, but none of them have described specific configurations of the memory devices.

As has been described in the above, despite various investigations into techniques relevant to the capacitor elements, the semiconductor devices still have a room for raising capacitance per unit area of the MIM capacitors, shrinking the memory cell size, and improving the operation speed.

SUMMARY

According to the present invention, there is provided a semiconductor device which includes:

a capacitor element which includes a flat-plate-type lower electrode provided over a semiconductor substrate, a flat-plate-type upper electrode provided over the lower electrode in parallel therewith, and a capacitor film provided between the lower electrode and the upper electrode; and a first contact plug brought into contact with the bottom surface of the lower electrode, and is composed of a metal material, wherein the capacitor film has a film which contains an organic molecule as a constituent.

The semiconductor device of the present invention has a film containing an organic molecule as a constituent, and has a first contact plug, brought into contact with the bottom surface of the lower electrode, composed of a metal material. The configuration is therefore high in accumulated amount of charge per unit area of the capacitor film, and is low in electric resistance of the contact plug. The semiconductor device of the present invention is configured as being excellent in capacitance and operation speed.

As has been described in the above, the present invention may increase capacitance per unit area of the MIM capacitor to thereby shrink the memory size, and may improve the operation speed

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will now be described herein with reference to an illustrative embodiments. Those skilled in the art will recognize that many alternative embodiments can be accomplished using the teachings of the present invention and that the invention is not limited to the embodiment illustrated for explanatory purposes.

Paragraphs below will explain embodiments of the present invention, referring to the attached drawings. In all drawings, any common constituents will be given with the same reference numerals, so as to avoid repetitive explanations.

First Embodiment

Figure 1:
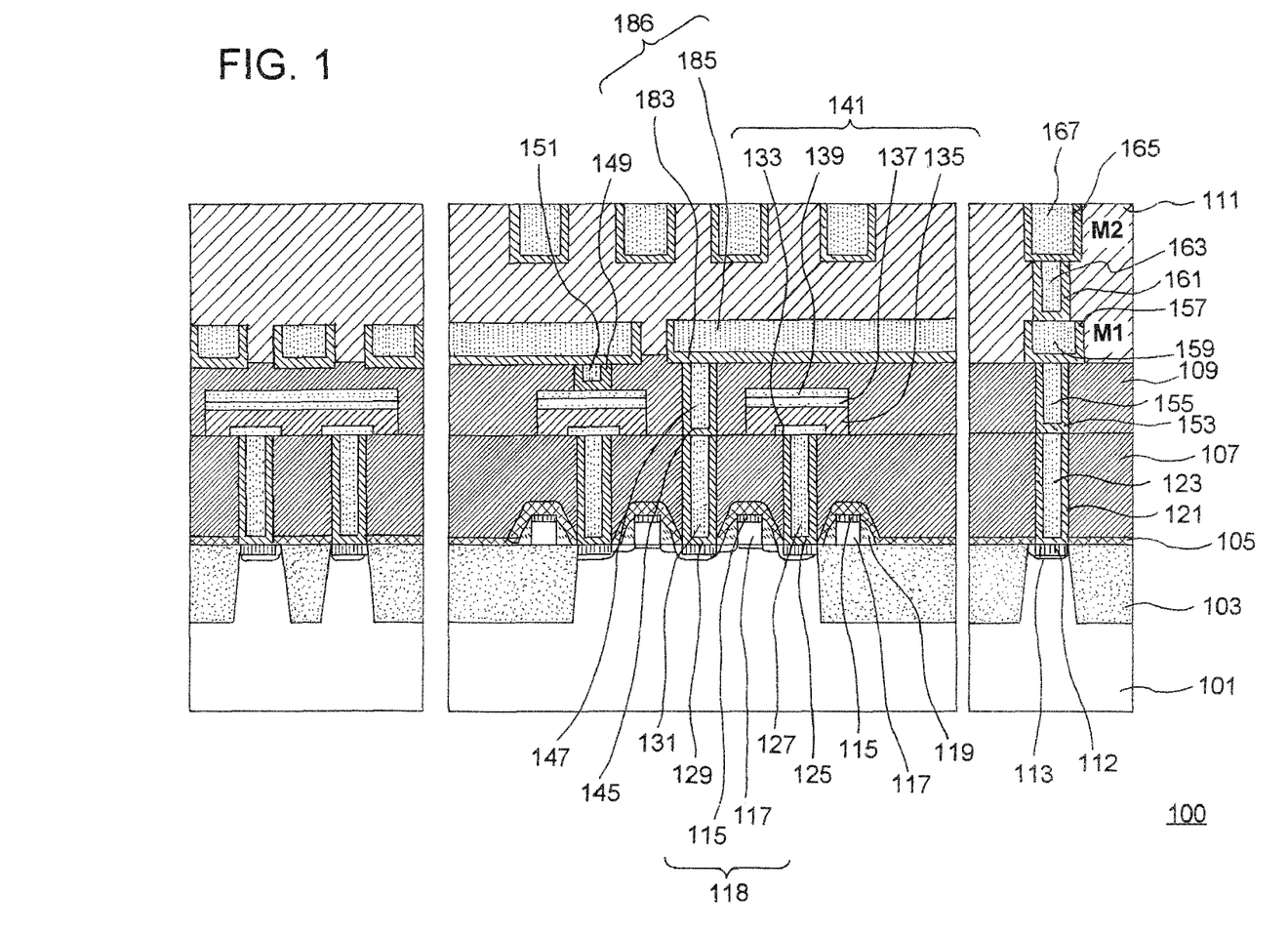
FIG. 1 to FIG. 6 are sectional views showing configurations of semiconductor devices in embodiments.

FIG. 1 is a sectional view showing a configuration of a semiconductor device of this embodiment. Of three sectional views in FIG. 1, the center drawing is a sectional view taken along the direction normal to the word line of the memory section, and the left drawing is a sectional view taken along the direction normal to the bit line of the memory section. The right drawing is a sectional view showing a logic section. Also in FIG. 2 to FIG. 7 described later, three these drawings are given in one set.

A semiconductor device 100 shown in FIG. 1 is a device having a first region (memory section) having bit lines 186 and capacitor elements 141, and a second region (logic section) having first interconnect while being embedded therein, and contains a silicon substrate 101, capacitor elements 141, and first contact plugs (first Cu plugs 127).

The capacitor element 141 is an MIM capacitor of the parallel flat plate type (planar type) composing DRAM (Dynamic Random Access Memory) cells, and has a flat-plate-type lower electrode 133 provided over the semiconductor substrate (silicon substrate 101), flat-plate-type upper electrodes (TiN film 137, W film 139) provided over the lower electrode 133 in parallel therewith, and a capacitor film 135 provided between the lower electrode 133 and the TiN film 137.

The semiconductor device 100 has so-called CUB (capacitor under bit line) structure having the capacitor elements 141 provided more closer to the silicon substrate 101 than the bit lines 186 are.

The capacitor film 135 has a film containing an organic molecule as a constituent. A specific configuration of the film containing an organic molecule will be described later.

The W film 139 and the TiN film 137 have planar geometry same with that of the capacitor film 135. The W film 139 is, on the top surface thereof, brought into contact with the contact plug composed of a barrier metal film 149 and a Cu plug 151.

The memory section and the logic section have transistors provided therein. Each transistor contains a gate electrode 118 provided over the silicon substrate 101, and first and second impurity-diffused layer regions (diffusion layers 113) provided in the silicon substrate 101 on both sides of the gate electrode 118. In FIG. 1, a polysilicon electrode 117 and a silicide layer 115 compose the gate electrode 118. The gate electrode 118 functions as a word line.

The first Cu plug 127 connects a first impurity-diffused layer (one of the diffusion layers 113) and the bottom surface of the lower electrode 133, and is composed of a copper-containing metal (copper (Cu), in this embodiment).

On the silicon substrate 101 having the transistors provided thereon, a silicon nitride film (SiN film) 105, an insulating interlayer 107, an insulating interlayer 109 and an insulating interlayer 111 are stacked in this order from the bottom. Of these, the insulating interlayer 107 has the above-described first Cu plug 127, a second contact plug composed of a barrier metal film 129 and a second Cu plug 131, and a contact plug in the logic section, composed of a barrier metal film 121 and Cu plug 123, provided therein.

These contact plugs are connected to the diffusion layers 113 formed in the silicon substrate 101, in the memory section and the logic section.

The second Cu plug 131 is composed of a copper-containing metal (Cu, in this embodiment), and connects one of the bit line 186 and one of the diffusion layers 113. More specifically, the second Cu plug 131 is brought into contact, on the bottom surface thereof, with a second impurity-diffused layer (another one of the diffusion layers 113). The second Cu plug 131 is brought into contact, on the top surface thereof, with a third contact plug composed of a barrier metal film 145 and a third Cu plug 147.

The contact plug in the logic section is brought into contact, on the top surface thereof, with a contact plug composed of a barrier metal film 153 and a Cu plug 155.

Both of the third Cu plug 147 and the Cu plug 155 are buried in the insulating interlayer 109 having the capacitor element 141 provided therein, while being extended through the insulating interlayer 109.

In the memory section, the insulating interlayer 111 has bit lines 186, each of which composed of a barrier metal film 183 and a Cu interconnect 185, provided therein. The bit lines 186 are formed in contact with the top portion of the insulating interlayer 109. The bit lines 186 are provided at the same level of height with the first interconnect in the logic section (barrier metal film 157, first Cu interconnect 159), and are formed in the same step of manufacturing. The "same level of height" in this patent specification specifically means provision in the same layer.

The first Cu interconnect 159 in the logic section is connected to a second interconnect composed of a barrier metal film 165 and a second Cu interconnect 167, through a plug composed of a barrier metal film 161 and a Cu plug 163. Both of the first and second interconnects are buried in the insulating interlayer 111. As shown in FIG. 1, also in the memory section, the upper interconnects may be provided at the same level of height with the second interconnect in the logic section.

Next, materials composing the capacitor film 135 will be explained.

The capacitor film 135 is a film containing an organic molecule as a constituent. More specifically, the organic molecule may be exemplified by a cyclic organic compound. Write/read of data relies upon redox property of the organic compound. The cyclic organic compound may be exemplified by a compound having a porphyrin skeleton or a ferrocene skeleton. This sort of organic compound changes state of charging of the molecule depending on redox reaction of the molecule. For example, the molecule is charged positive in the oxidized state, and has no charge in the reduced state. Use of a single molecular film of this sort of molecule as a capacitor element enables write and read of data, making use of state of charging. For example, when data is read out, two different states may be discriminated based on change in the amount of current flowing through the film, depending on the state of charging of molecule under current supply through the film. Also when data is written, two different states corresponded to oxidation reaction and reduction reaction of the molecule are used.

For the case where the organic molecule is a compound having a porphyrin skeleton, a central metal atom held in a porphyrin ring is not specifically limited, and may be exemplified by Zn, Mg, Fe, Co and so forth.

The porphyrin ring may have predetermined side chain(s) bounded thereto, for the purpose of improving affinity to the lower electrode 133. For example, substituent(s) each having a straight or cyclic hydrocarbon group, thiol group, hydroxyl group or the like may be bound to carbon atom(s) connecting the pyrrole rings in the porphyrin ring.

On the other hand, for the case where the organic molecule is a compound having a metallocene skeleton, such as ferrocene, species of metal atom is not specifically limited, and may be exemplified by Fe, Zr, Ti, Hf and so forth.

The compound having a metallocene skeleton may have substituent(s) bound to the cyclopentadiene portion(s), and for example, substituent(s) each having a straight or cyclic hydrocarbon group, thiol group, hydroxyl group or the like may be bound to carbon atom(s) composing the cyclopentadiene ring(s).

The organic molecule may physically be adhered to the lower electrode 133, or may chemically be bound thereto. The organic molecule film may be provided while being brought into contact with the top portion of the lower electrode 133, or while placing an intermediate layer. For example, a coupling agent such as silane coupling agent may be provided on the top surface of the lower electrode 133, and the organic molecule may be bound to the coupling agent.

Figure 8:
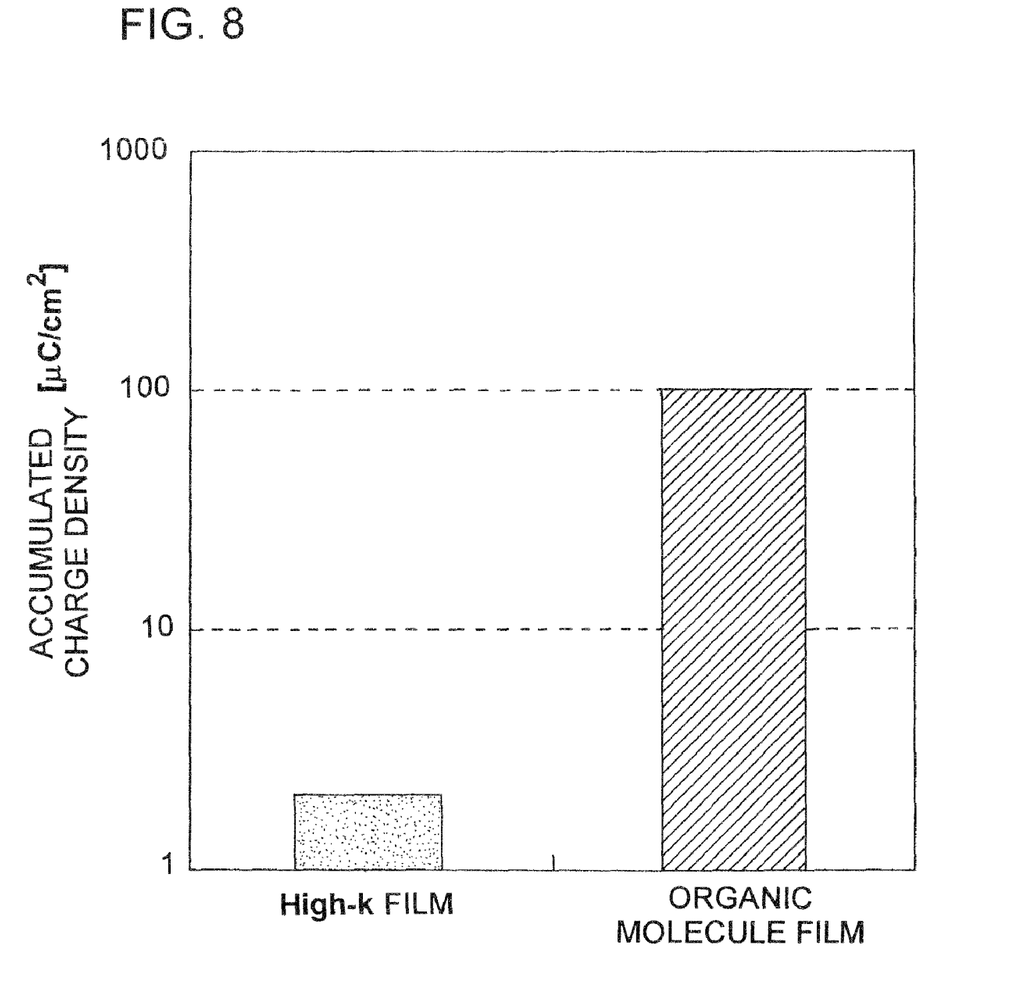
FIG. 8 is a drawing showing accumulated charge density of the capacitor film of the capacitor element in one embodiment.

FIG. 8 is a drawing showing an example of comparison between accumulated charge density of the organic molecule-containing insulating film and a high-k film.

In FIG. 8, accumulated charge density per unit area for the case where $ZrO_2$, $HfO_2$ and $Ta_2O_5$ were used for composing the high-k film was calculated as described below.

Amount of charge Q is given by Q=CV. Dielectric constant of vacuum is given by $\epsilon_0 = 8.85 \times 10^{-18}$ F/μm. Assuming now that dielectric constant of the high dielectric constant film as $\epsilon_r = 20$ to 30, and thickness of the capacitor film as $t = 100 \times 10^{-4}$ μm, amount of charge per unit area is given by $C = \epsilon_0 \epsilon_r \times 1/t = 2$ to $3$ μC/cm².

On the other hand, for an exemplary case where a compound having a porphyrin skeleton is used as the insulating film containing an organic molecule, the accumulated charge density per unit area was calculated using the equation below.

In this case, the amount of charge Q per unit area may be given by $Q = F \times 1 \times \Gamma$, where F represents Faraday constant given by F=96485 C/mol, and $\Gamma$ represents molecular density of the organic molecule film typically given by $\Gamma = 1.1 \times 10^{-9}$ mol/cm², thereby the amount of charge C per unit area may be given as approximately 100 μC/cm².

It is known from FIG. 8 that, by using the organic molecule film, the amount of charge per unit area may considerably be increased (approximately by 50 times, for the case shown in FIG. 8) as compared with the case of using a high-k film.

Figure 7A:
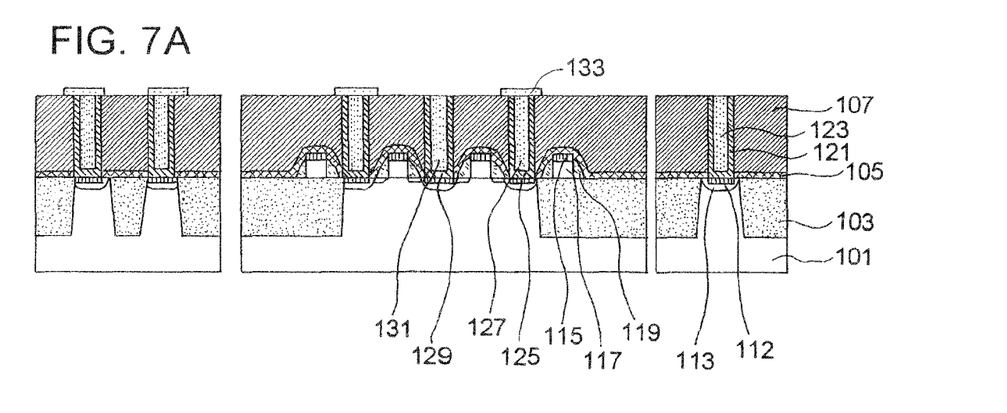
FIGS. 7A to 7C are sectional views showing steps of manufacturing the semiconductor device shown in FIG. 1.
Figure 7B:
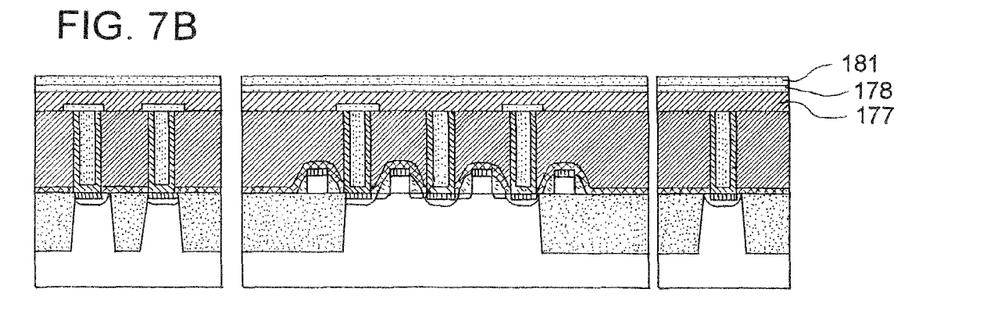
Figure 7C:
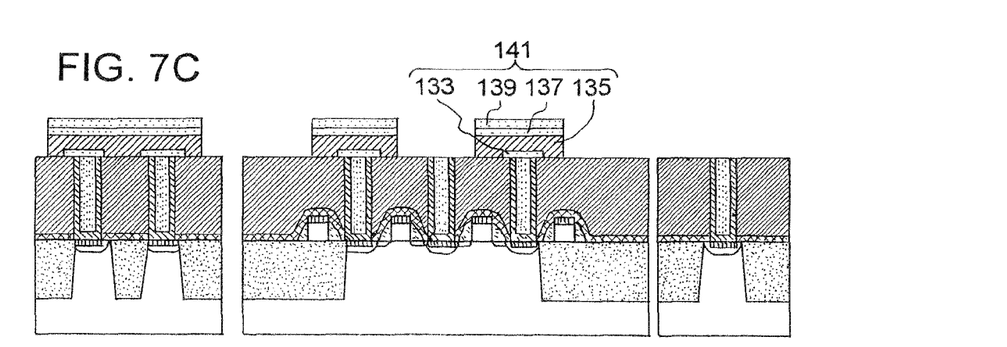

Next, a method of manufacturing the semiconductor device 100 shown in FIG. 1 will be explained referring to FIG. 7A to FIG. 7C. FIG. 7A to FIG. 7C are sectional views showing steps of manufacturing the semiconductor device 100.

The method of manufacturing the semiconductor device 100 in this embodiment includes the steps below:

step 11: forming a first contact plug (barrier metal film 125, first Cu plug 127) and a second contact plug (barrier metal film 129, second Cu plug 131) at the same level of height, over the silicon substrate 101;

step 12: forming the lower electrode 133 so as to cover the top surface of the first contact plug;

step 13: forming the capacitor film 135 containing an organic molecule as a constituent so as to cover the entire surface of the region having the lower electrode 133 formed therein;

step 14: forming, after step 13, the upper electrode (TiN film 137, W film 139) over the capacitor film 135, and then processing the capacitor film 135, TiN film 137 and W film 139 according to a predetermined pattern to thereby form the parallel-plate-type capacitor elements 141; and step 15: forming the bit lines 186 (barrier metal film 183, Cu interconnect 185) over the capacitor elements 141.

Paragraphs below will further specifically explain the method of manufacturing the semiconductor device 100.

First, as shown in FIG. 7A, device isolation regions 103 and the transistors are formed at predetermined positions on the device-forming surface of the silicon substrate 101. The process include a step of forming a gate insulating film (not shown) over the silicon substrate 101, a step of forming polysilicon electrode 117, a step of forming the diffusion layers 113 on both sides of the polysilicon electrodes 117, a step of forming sidewall insulating films 119 on both sides of the polysilicon electrodes 117, and a step of forming silicide layers 112 and silicide layers 115 on the diffusion layers 113 and the polysilicon electrodes 117, respectively. Thereafter, the SiN film 105 and the insulating interlayer 107 are sequentially formed over the entire surface of the device-forming surface of the silicon substrate 101. These insulating films are selectively removed in the portions above the diffusion layers 113, and the first and second contact holes extended through these insulating films are formed. The barrier metal film and the Cu film are then formed over the entire surface of the insulating interlayer 107. The Cu film is formed so as to fill up the individual contact holes. Portions of the Cu film and the barrier metal film formed outside the individual contact holes are removed, and thereby the first and second contact plugs connected to the individual diffusion layers 113 are formed. The first and second contact plugs are formed as being brought into contact with the diffusion layers 113, while placing the silicide layers 112 on the diffusion layers 113 in between.

Next, the TiN film is formed over the entire surface of the insulating interlayer 107, and then processed to a predetermined pattern, to thereby form the lower electrodes 133.

Next, a capacitor film containing an organic molecule is formed over the entire surface of the silicon substrate 101 having the lower electrodes 133 formed thereon. This embodiment shows an exemplary case where a compound having a porphyrin skeleton, which is a cyclic organic compound, is used. A compound having a porphyrin skeleton is spread by spin coating over the entire surface of the silicon substrate 101 having the lower electrodes 133 formed thereon, and annealed at around 300° C., to thereby form a single molecular film of the organic molecule (insulating film 177) Method and conditions (conditions of heating and so forth) for forming the insulating film 177 may be selected depending on the material used herein. Alternative methods of forming the film adoptable herein include vacuum evaporation and CVD (Chemical Vapor Deposition). Thereafter, a TiN film 178 and a W film 181 are sequentially formed over the insulating film 177 (FIG. 7B).

The insulating film 177, TiN film 178 and the W film 181 are then processed to a predetermined planar pattern by using lithographic and etching techniques, to thereby form the capacitor elements 141 connected to the first Cu plugs 127 (FIG. 7C).

Thereafter, the insulating interlayer 109 is formed so as to cover the capacitor elements 141, and the individual plugs, bit lines 186 and other interconnects are formed by the single damascene process. The semiconductor device 100 shown in FIG. 1 may be obtained by these procedures. After the above-described procedures, additional interconnect(s) and so forth may be stacked over the silicon substrate 101.

Next, the operations and effects of this embodiment will be explained.

In this embodiment, the capacitor film 135 of the capacitor element 141 contains a film containing a compound having a porphyrin skeleton as a constituent. Accordingly, the capacitance per unit area may considerably be improved as compared with the case where the conventional high-k film was used. As a consequence, this embodiment typically allows IDRAM to improve the hold characteristics and operation speed, to lower the operation voltage, and to shrink the cells.

In addition, by using the capacitor film 135 containing a compound having a porphyrin skeleton, the capacitance may be ensured to a satisfiable degree, even if the parallel-plate-type capacitor element 141 is adopted in the device of the CUB structure. The CUB structure, having the bit line contact plugs (third Cu plug 147) formed so as to extend through the layer having the capacitor elements 141 formed therein, may be more restricted in region where the capacitor elements 141 may be formed, as compared with the COB structure, whereas this embodiment can ensure capacitance per unit area to a satisfiable degree even in this situation. In addition, by adopting the CUB structure and the parallel-plate-type capacitor element, the number of steps of manufacturing may be reduced, and the process may be simplified, as compared with the case where the COB structure and cylinder-type capacitor element are formed.

This embodiment may ensure a sufficient distance between the third Cu plug 147, which functions as a contact for connection with the bit line, and the capacitor elements 141 even in the CUB structure, so that short-circuiting between the electrodes of the capacitor elements 141 and the third Cu plug 147 may be suppressed. Adoption of the CUB structure also effectively suppresses short-circuiting between the bit lines 186 and the capacitor contact plugs.

By using the film containing a compound having a porphyrin skeleton as the capacitor film 135, temperature of heating in the process of forming the capacitor film 135 may be set in a lower region typically at 300° C. or below. Accordingly, damages to the contact plugs may effectively be suppressed, even if a copper-containing metal such as Cu is selected as a material for composing the contact plugs formed under the capacitor film 135. The configuration allows use of Cu plugs as the plugs for connection with the diffusion layers 113, and may therefore reduce resistivity of the contact plugs and contact resistance with the lower electrodes 133. As a consequence, the semiconductor device 100 may be configured as being excellent in the operation speed of the memory section.

In this embodiment, the bit lines 186 are formed in the same step with the first interconnect in the logic section, using Cu as the interconnect material. By virtue of this configuration, resistivity of interconnect may further be reduced as compared with the case where W/TiN is used as the interconnect material.

The explanation below will mainly deal with aspects different from those in the first embodiment.

Second Embodiment

Figure 2:
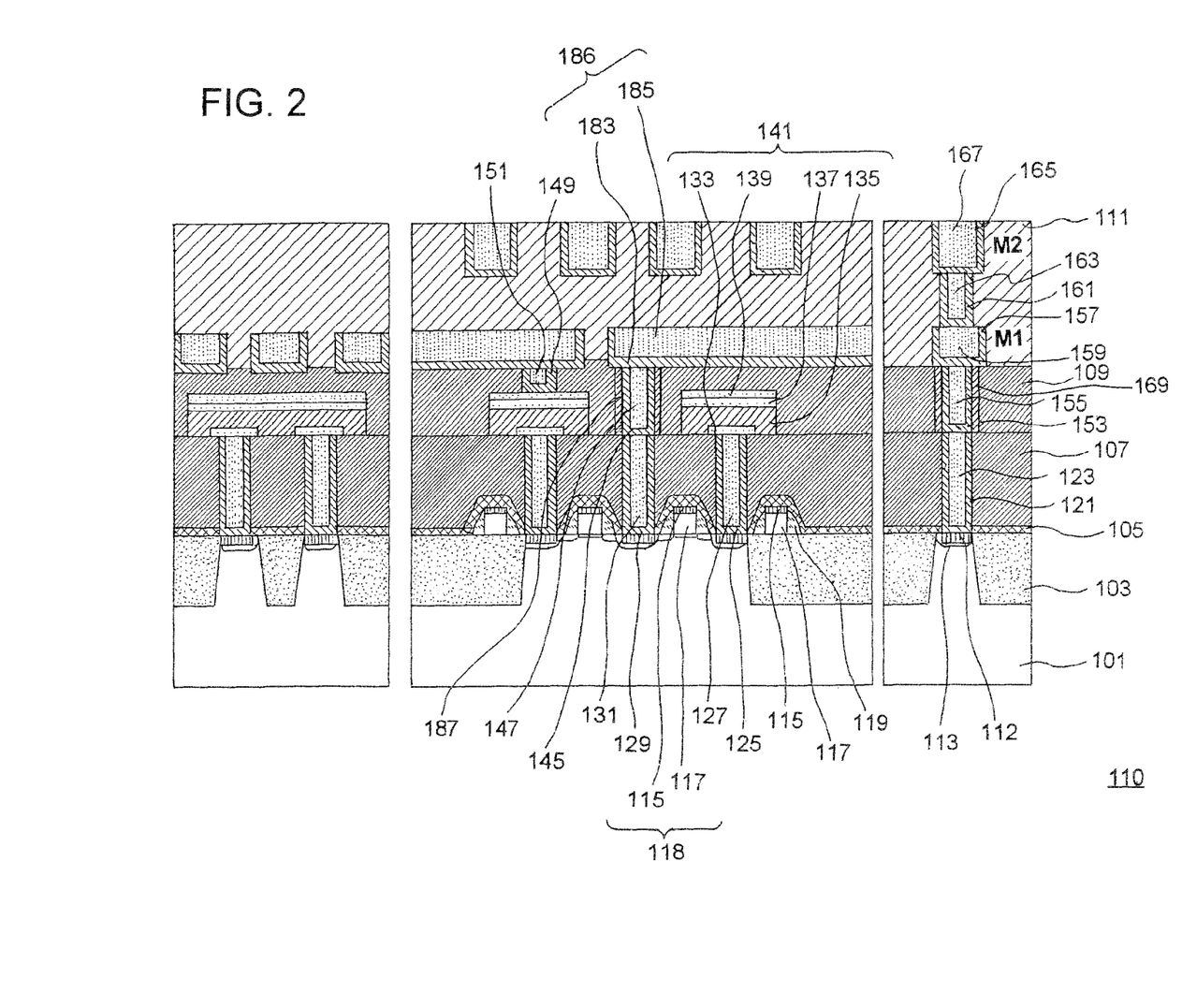

FIG. 2 is a sectional view showing a configuration of a semiconductor device of this embodiment. Basic configuration of a semiconductor device 110 shown in FIG. 2 is similar to that of the semiconductor device 100 (FIG. 1) described in the first embodiment, except that the outer circumference of the side face of the third contact plug, composed of the barrier metal film 145 and the third Cu plug 147, is covered with a SiN film 187.

By virtue of this configuration, in addition to the operations and effect of the first embodiment, short-circuiting between the third Cu plug 147, which functions as a bit line contact plug, and the electrodes of the capacitor elements 141 may more reliably be suppressed. In addition, distance between the barrier metal film 145 and the capacitor elements 141 may be narrowed, so that the degree of integration of devices or area of the capacitor element 141 may be increased.

Third Embodiment

The second embodiment showed a configuration having the SiN film 187 provided on the outer circumference of the side face of the barrier metal film 145, whereas the SiN film may alternatively be provided on the outer circumference of the side faces of the capacitor elements 141.

Figure 3:
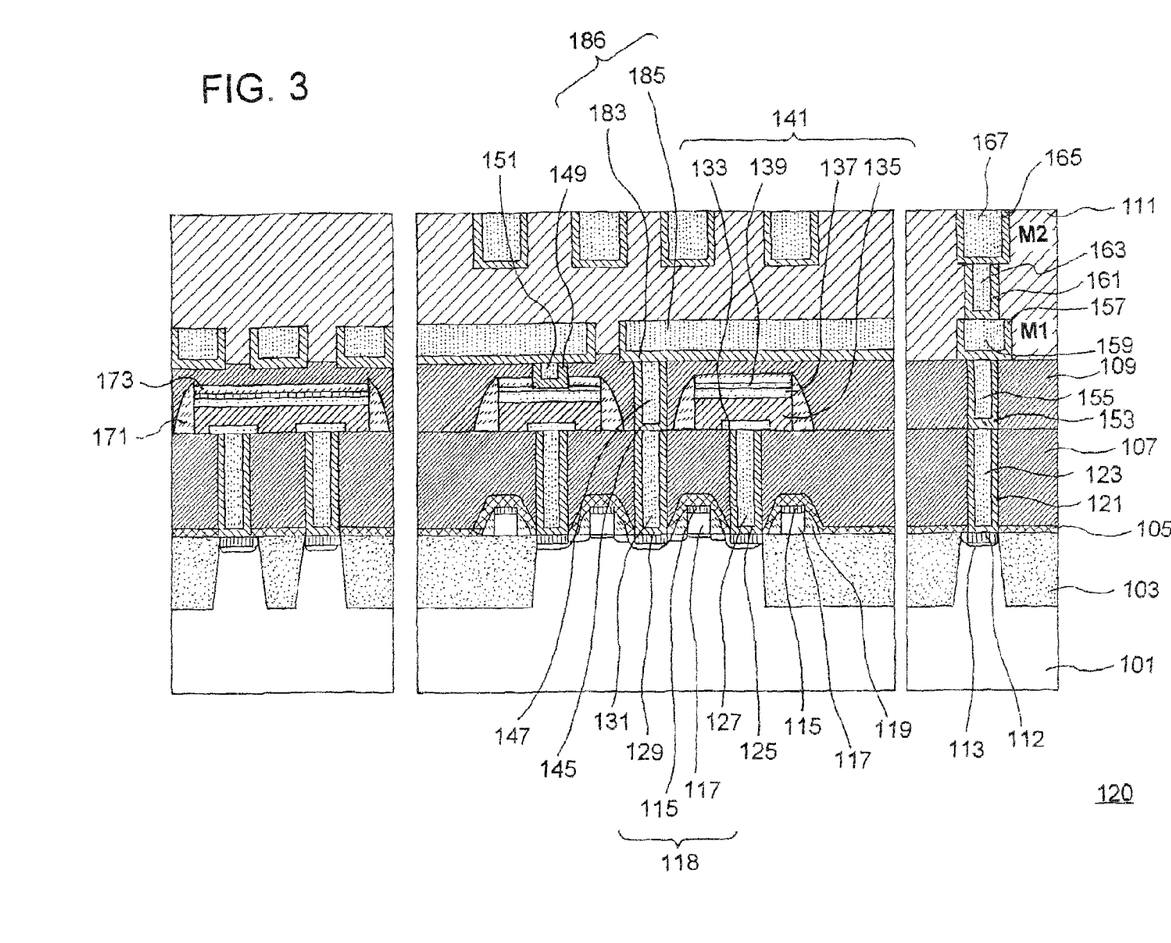

FIG. 3 is a sectional view showing a configuration of a semiconductor device of this embodiment. Basic configuration of a semiconductor device 120 shown in FIG. 3 is similar to that of the semiconductor device 100 (FIG. 1) described in the first embodiment, except that sidewall insulating films (SiN films 171) are provided so as to selectively cover the side faces of the capacitor elements 141. In the semiconductor device 120, also the top surface of the W film 139 is covered with a SiN film 173.

By virtue of this configuration, in addition to the operations and effects of the first embodiment, short-circuiting between the third Cu plug 147, which functions as a bit line contact plug, and the electrodes of the capacitor elements 141 may more reliably be suppressed. In addition, distance between the barrier metal film 145 and the capacitor elements 141 may be narrowed, so that the degree of integration of devices or area of the capacitor element 141 may be increased.

Figure 5:
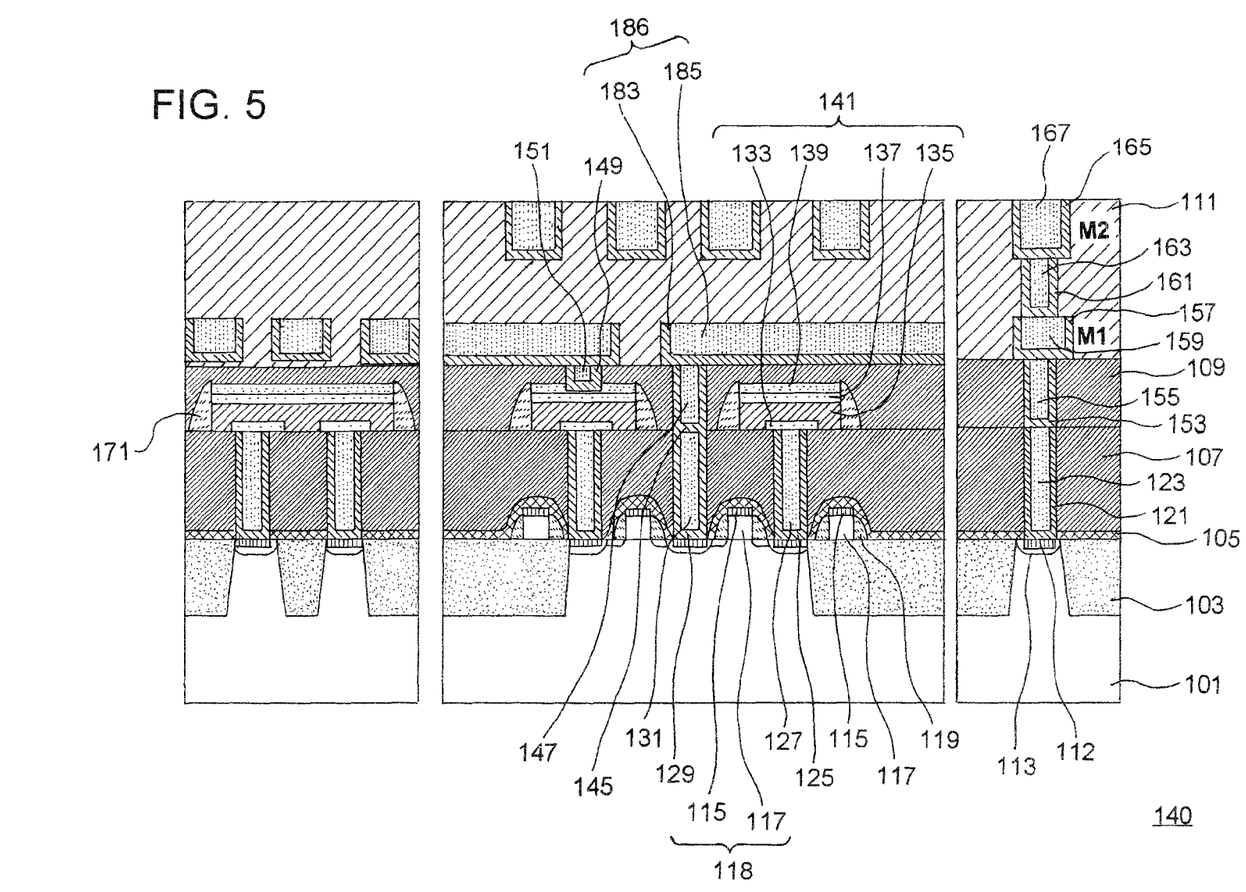

While the configuration shown in FIG. 3 was such that the SiN film was provided selectively on the side faces and the top surfaces of the capacitor elements 141, so as to cover the capacitor elements 141 from the side faces to the top surfaces thereof, the SiN film may be provided only on the side faces of the capacitor elements 141. FIG. 5 is a sectional view showing a configuration of a semiconductor device 140 having the SiN film 171 but having no SiN film 173.

The configuration shown in FIG. 3 may suppress the short-circuiting between the bit lines 186 and the capacitor elements 141, in a more reliable manner as compared with the configuration shown in FIG. 5.

Figure 6:
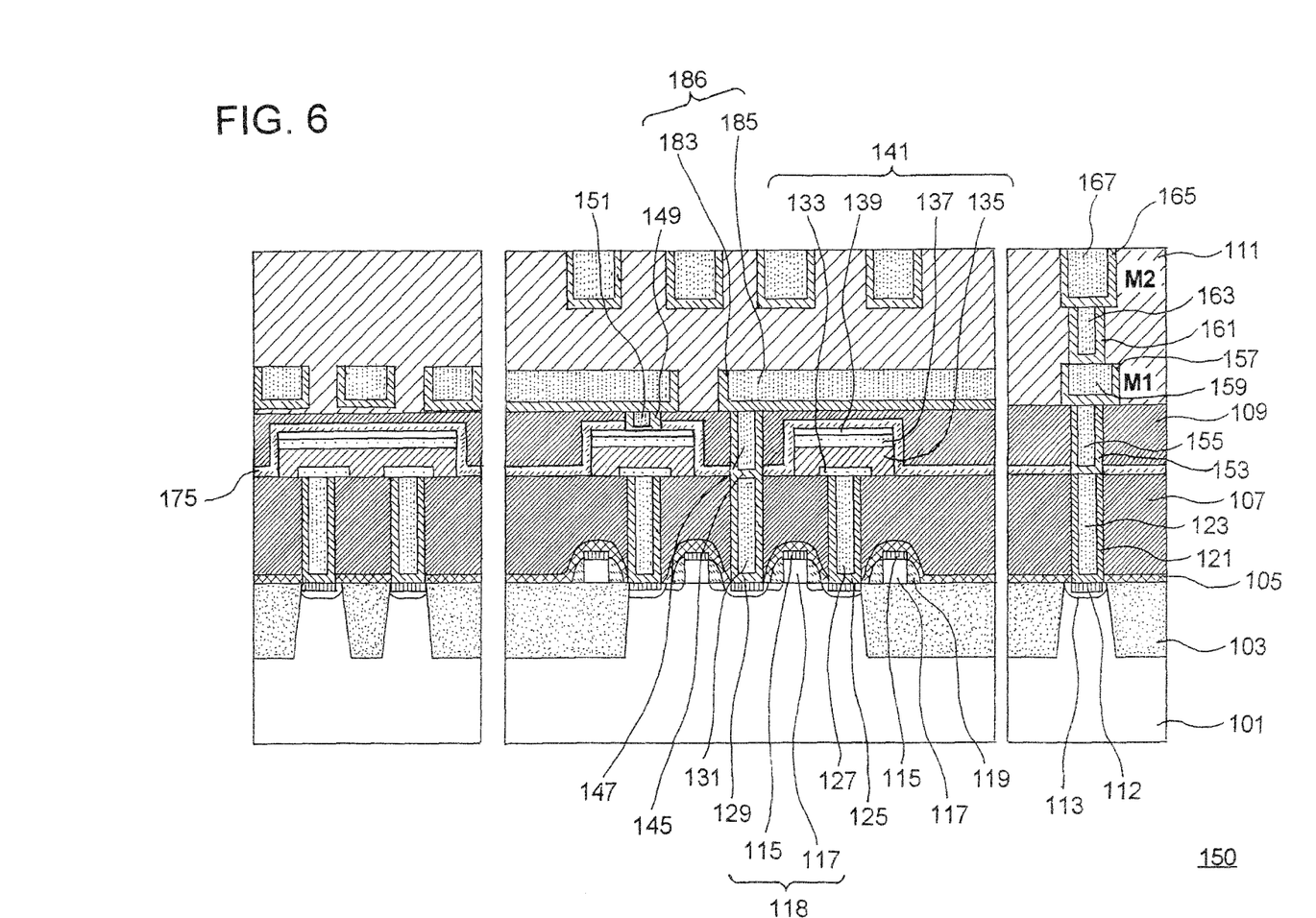

While the configuration shown in FIG. 3 was such that the SiN film 171 and the SiN film 173 were provided respectively on the side faces and the top surfaces of the capacitor elements 141, the SiN film 175 may be provided, after the capacitor elements 141 were formed, over the entire surface of the insulating interlayer 107 having the capacitor elements 141 formed therein. FIG. 6 is a drawing showing a configuration of such semiconductor device 150. In the semiconductor device 150, the SiN film 175 is provided selectively on the side faces and the top surface of the capacitor elements 141, so as to cover the capacitor elements 141 from the side faces to the top surfaces thereof, thereby operations and effects similar to those of the semiconductor device 120 may be obtained.

Fourth Embodiment

Figure 4:
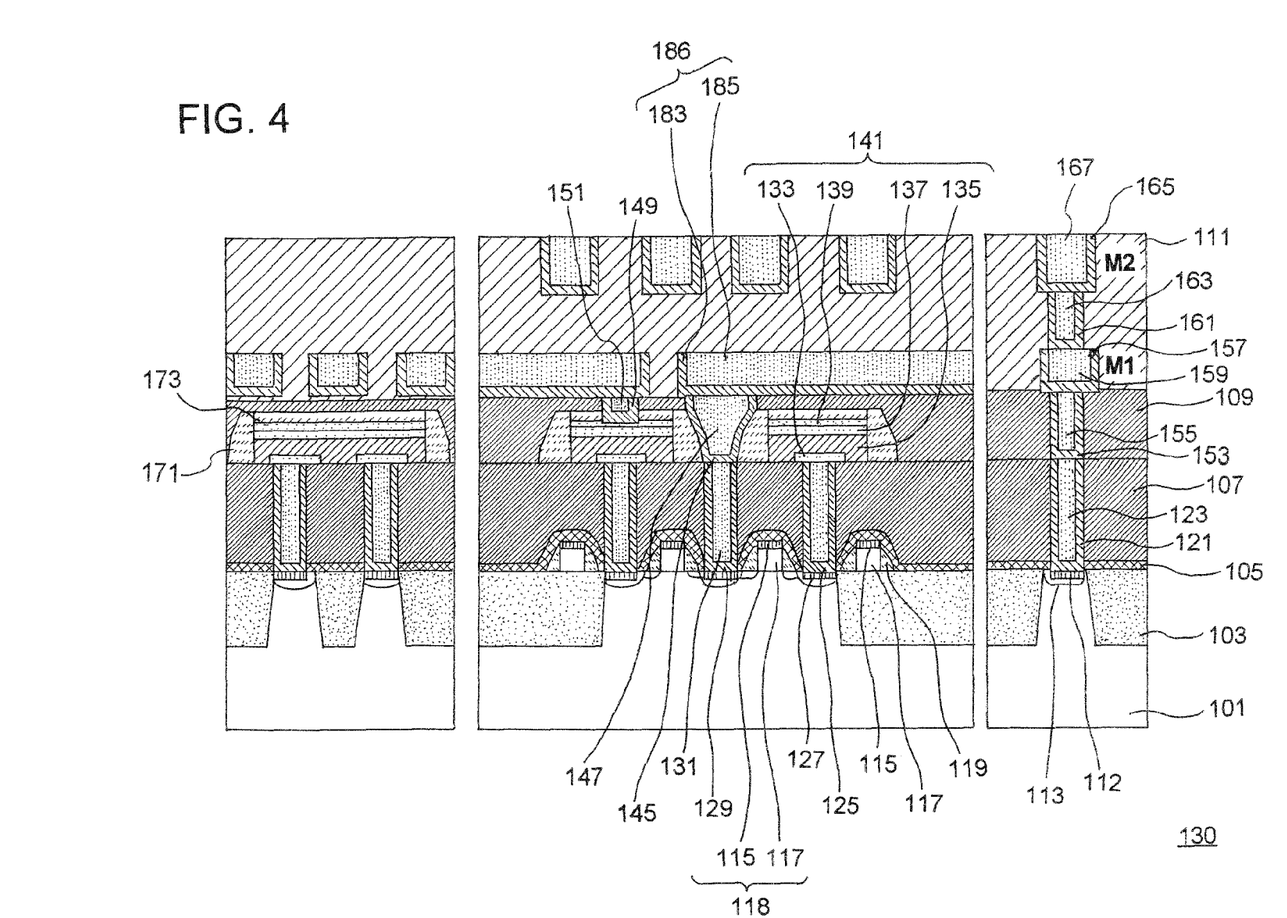

FIG. 4 is a sectional view showing a configuration of a semiconductor device of this embodiment. Basic configuration of a semiconductor device 130 shown in FIG. 4 is similar to that of the semiconductor device 120 (FIG. 3) described in the third embodiment, except that the third contact plug, which is composed of the barrier metal film 145 and the third Cu plug 147, is formed in a self-aligned manner while being brought into contact with the side faces of the SIN film 171.

By forming the third contact plug as a self-aligned contact with respect to the SiN film 171, in addition to the operations and the operations and effects of the third embodiment, electrical short-circuiting between the bit lines 186 and the capacitor elements 141 (in particular the upper electrodes composed of the TiN film 137 and the W film 139) may be prevented, and the highly reliable contacts may be formed.

Fifth Embodiment

Figure 9:
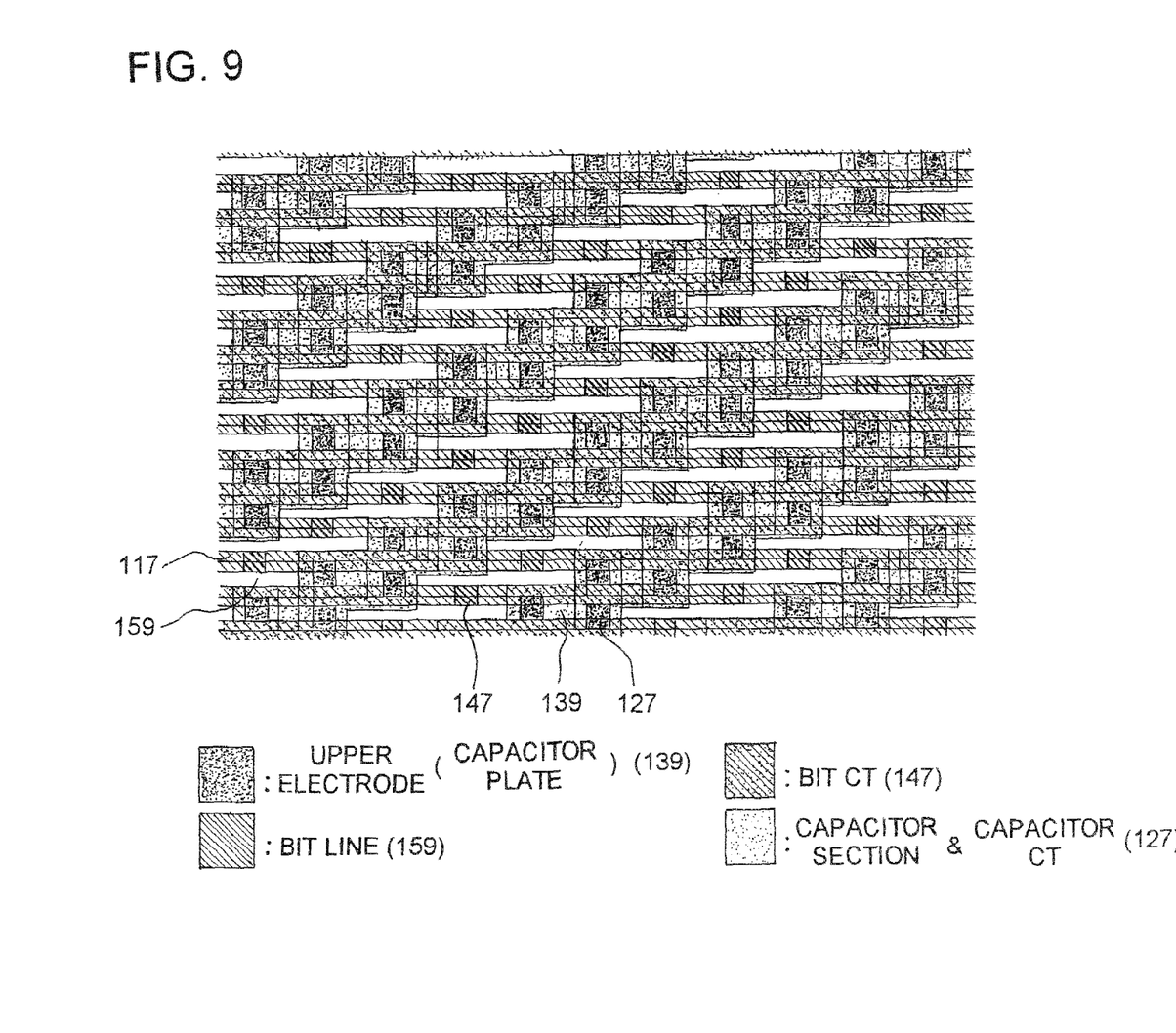
FIG. 9 to FIG. 11 are plan views showing configurations of the semiconductor devices in the embodiments.
Figure 10:
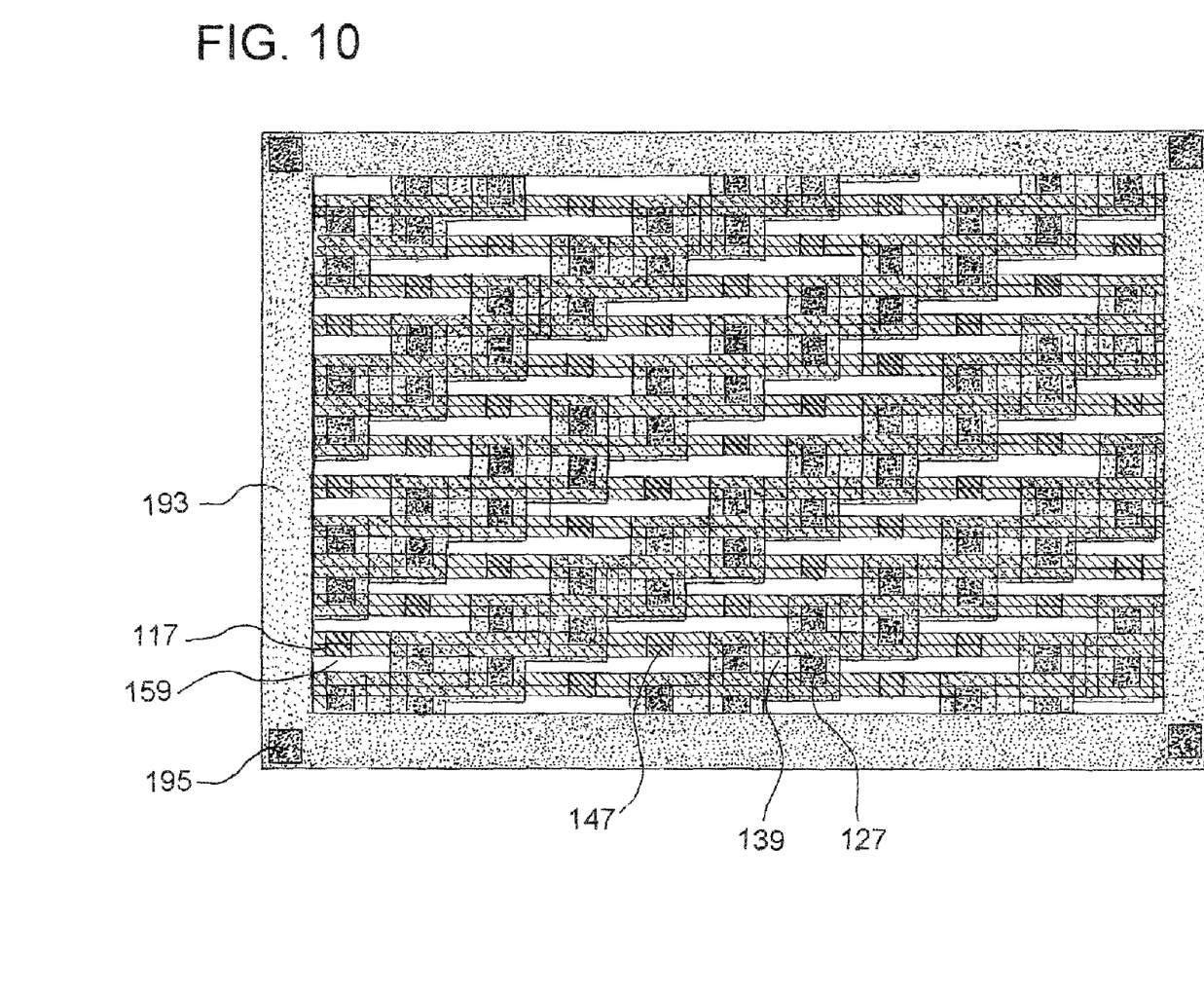
Figure 11:
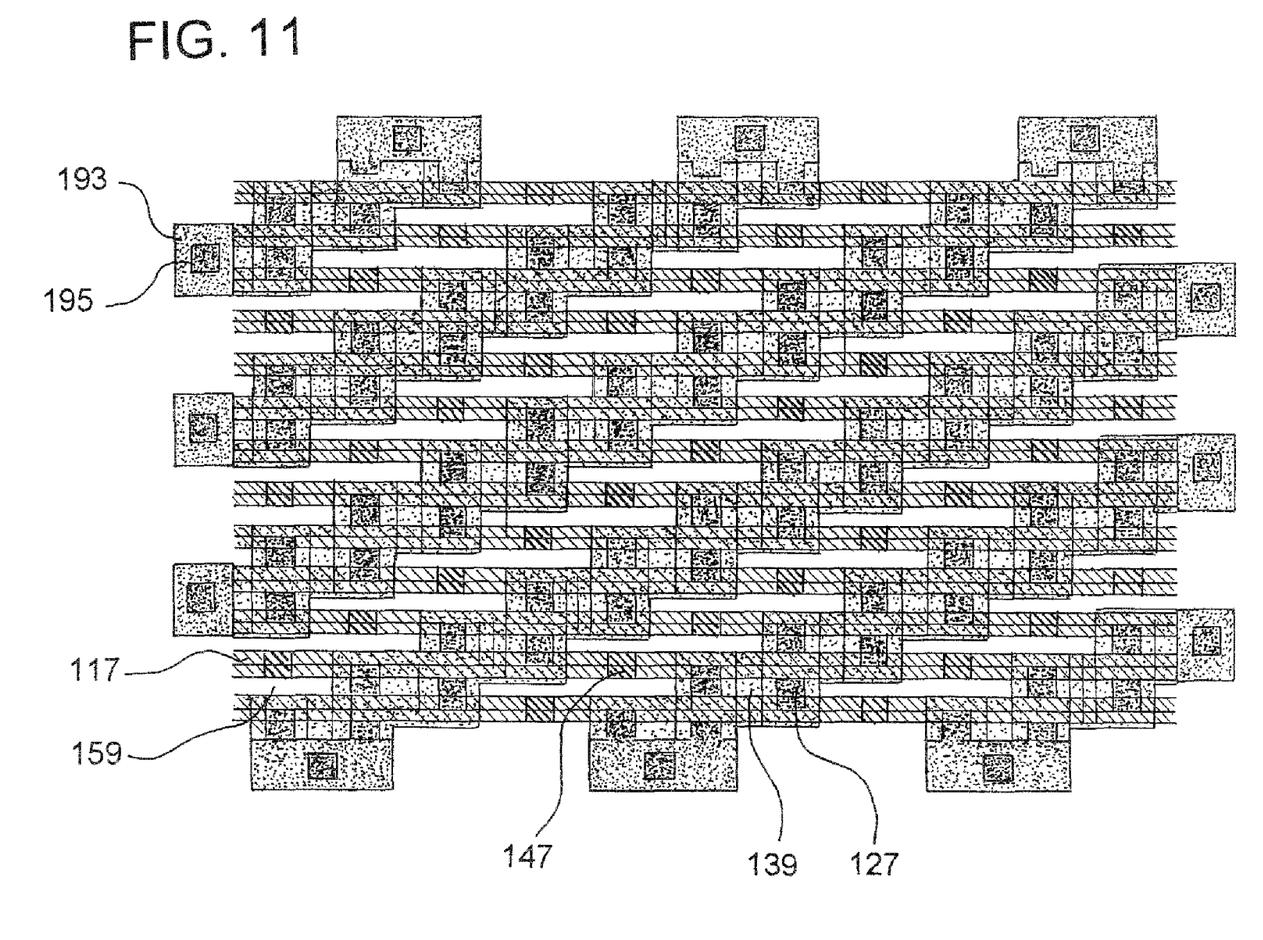

In this embodiment, examples of planar configuration of the capacitor element 141 described in the above embodiments will be explained.

In the semiconductor devices described in the above embodiments, the upper electrodes (TiN films 137, W films 139) of the adjacent capacitor elements 141 are provided in common as shown in the left drawings of FIG. 1 to FIG. 6. Examples of this sort of planar layout of the capacitor elements 141 may be given as shown in FIG. 9 to FIG. 11.

In FIG. 9 to FIG. 11, the upper electrodes (W films 139) of a plurality of adjacent capacitor elements 141 are provided while being continuously integrated to form bands in a plan view. "Continuously integrated" herein means that the upper electrodes are formed in an integrated manner to give a continuous body. The upper electrodes are preferably composed of a single component, without having any joint portion. In FIG. 9 to FIG. 11, the third Cu plugs 147 which function as the hit line contact plugs and the first Cu plugs 127 which function as the capacitor contact plugs are arranged according to a lattice pattern, wherein a plurality of zigzag band-formed W films 139 are provided. Each W film 139 extends in the direction of extension of the third Cu plug 147.

Figure 12:
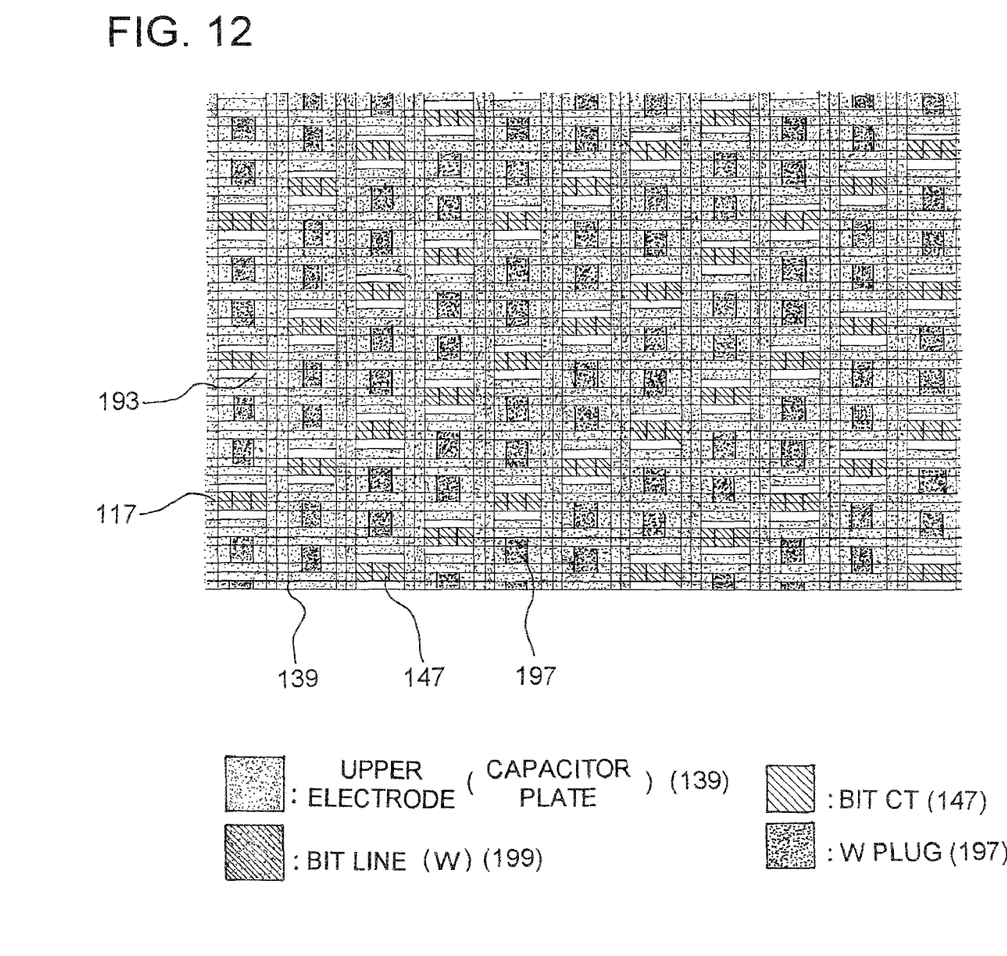
FIG. 12 is a plan view showing a configuration of a conventional semiconductor device.
Figure 13:
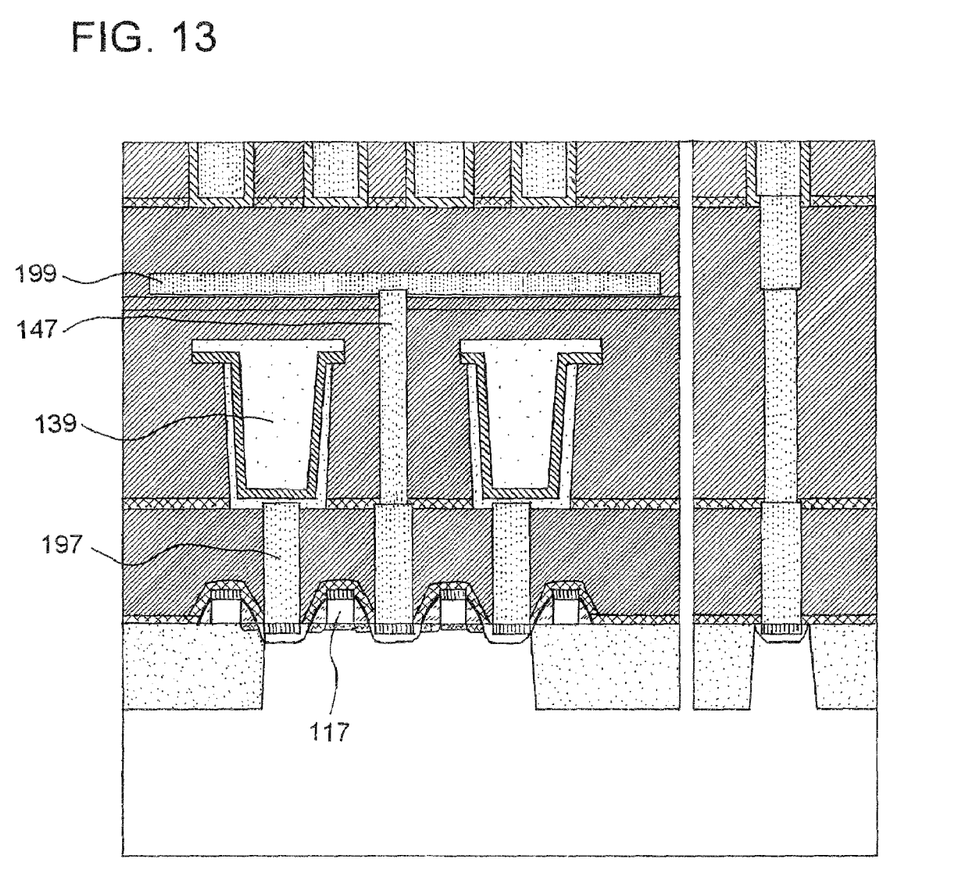
FIG. 13 is a sectional view showing a configuration of a conventional semiconductor device.

For the case where the conventional high-k film is applied to the CUB-type DRAM cell structure, capacitance required for DRAM operation, under the ongoing shrinkage of cell size, has been ensured by forming recessed cylinder-type capacitor elements aiming at increasing the surface area. Because of practical limitation in height of the cylinders due to technical problems in manufacturing, such as etching, the cylinders necessarily have a possibly-largest area (in-plane direction). This issue will be explained referring to FIG. 12 and FIG. 13. FIG. 12 and FIG. 13 show a configuration of a memory section having the cylinder-type capacitor elements, wherein FIG. 12 is a plan view, and FIG. 13 is a sectional view. In FIG. 12 and FIG. 13, tungsten (W) is used as a material composing both of the capacitor contact plugs (W plugs 197) and the bit lines 199. Because area of the cylinders relative to that of the cell array is large, it is difficult in this case to arrange the upper electrodes of the adjacent capacitor elements 141 according to a band pattern as shown in FIG. 12 and FIG. 13. For the case where the cylinder-type capacitor elements are required for the purpose of increasing capacitance as described in the above, the upper electrode is generally formed over the entire surface, so that the possibly-largest area of the cylinders may be determined by the size of openings formed therebetween in the upper electrode corresponding to the bit contact portions, so far as short-circuiting between the bit contacts and the upper electrode is avoidable.

On the other hand, for the case where the organic molecule film is used for the capacitor elements, only an area as small as 1/30 to 1/50 times will suffice to realize the same level of capacitance obtainable by the capacitor elements using the high-k film. Accordingly, not only the capacitor elements may structurally be modified from the cylinder-type to planar-type, but also the planar-type capacitor portion may be reduced in the area to a considerable degree. As a consequence, the upper electrodes may be arranged according to a band pattern, and electrical short-circuiting may be avoidable by widening the distance between the upper electrodes and the bit contacts. More specifically, as shown in FIG. 9 to FIG. 11, each W film 139 is provided in common for a plurality of capacitor elements 141, so that both of the regions for forming the W films 139 and the regions for forming the third Cu plugs (bit contact plugs) 147 are given in band forms, and alternately arranged. Further shrinkage of cell size may be realized by adopting a method of forming the bit contact based on the self-aligned contact process.

The plurality of band-formed W films 139 may be connected in the periphery of the portion for forming the capacitor elements 141, or may not.

FIG. 10 shows an exemplary provision of an electrode 193 covering the outer circumference of the region for forming the capacitor elements 141, and plugs 195 connected to the electrode 193. Each W film 139 is connected to the electrode 193 at the ends thereof.

FIG. 11 shows an exemplary provision of the electrodes 193 and the plugs 195 on both ends of each W film 139. In FIG. 11, the individual plugs 195 are connected to the common upper interconnect (not shown).

By providing the electrodes 193 and the plugs 195 as shown in FIG. 10 and FIG. 11, variation in potential or voltage of the plurality of capacitor elements 141 may further exactly be suppressed, and thereby the operational stability may be improved.

The embodiments of the present invention have been described in the above referring to the attached drawings, wherein they are merely for exemplary purposes, and allow adoption of any other various configuration other than those described in the above.

For example, the embodiments in the above dealt with the exemplary cases where the capacitor film 135 covers the lower electrodes 133 from the side faces to the top surfaces thereof, wherein the capacitor film 135 may be good enough if it is formed at least in a partial region between the lower electrodes 133 and the TiN films 137. The capacitor film 135 may be a single-layered film, or may be a stack of a plurality of films.

The embodiments in the above dealt with the exemplary cases where the contact plugs right above the diffusion layers were the Cu plugs, whereas a material composing the contact plugs is not limited thereto, and may be a coppers containing metal, or other metal such as tungsten (W). Although W has resistivity larger than that of Cu, W may be selectable as a material composing the contact plugs depending on needs, because the present invention raises an effect of shrinking the cells by virtue of increase in the accumulated amount of charge per unit area of the capacitor elements.

In the above-described embodiments, materials composing the individual insulating interlayers may not specifically be limited, but may be exemplified by a silicon oxide film. Materials for composing the individual barrier metals may be exemplified by TiN, Ta, TaN and so forth.

It is apparent that the present invention is not limited to the above embodiment, that may be modified and changed without departing from the scope and spirit of the invention.

What is claimed is:

1. A semiconductor device comprising:
   a capacitor element comprising a flat-plate-type lower electrode provided over a semiconductor substrate, a flat-plate-type upper electrode provided over said lower electrode in parallel therewith, and a capacitor film provided between said lower electrode and said upper electrode;
   a first contact plug brought into contact with the bottom surface of said lower electrode, and is composed of a metal material;

a first impurity-diffused layer provided in the surficial portion of said semiconductor substrate;
a gate electrode provided over said semiconductor substrate, and on the lateral side of said first impurity-diffused layer;
a second impurity-diffused layer provided in said semiconductor substrate on the lateral side of said gate electrode, while being opposed with said first impurity-diffused layer;
a bit line provided over said semiconductor substrate; and
a second contact plug connecting said bit line and said second impurity-diffused layer, and is composed of a copper-containing metal,
wherein said capacitor film has a film which contains an organic molecule as a constituent,
wherein said upper electrode comprises a first and second layer,
wherein said first contact plug is brought into contact with said first impurity-diffused layer, and is composed of a copper-containing metal,
wherein said capacitor element is provided more closer to said substrate than said bit line is,
wherein a first region having said capacitor element and said bit line, and a second region having a first interconnect provided over said semiconductor substrate, are provided over said semiconductor substrate, and
said bit line and said first interconnect are provided at the same level of height,
said first region is arranged according to a lattice pattern, and said second region is not arranged according to the lattice pattern.

2. The semiconductor device as claimed in claim 1, wherein said organic molecule is a cyclic organic compound.

3. The semiconductor device as claimed in claim 1, wherein said organic molecule is a compound having a porphyrin skeleton or a ferrocene skeleton.

4. The semiconductor device as claimed in claim 1, wherein the outer circumference of the side face of the said second contact plug is covered with a silicon nitride film.

5. The semiconductor device as claimed in claim 1, further comprising a sidewall insulating film selectively covering the side face of said capacitor element.

6. The semiconductor device as claimed in claim 1, further comprising:
a second impurity-diffused layer provided to said semiconductor substrate;
a bit line provided over said semiconductor substrate;
a second contact plug connecting said bit line and said second impurity-diffused layer, and is composed of a copper-containing metal; and
a sidewall insulating film selectively covering the side face of said capacitor element,
wherein said second contact plug is provided as being brought into contact with said sidewall insulating film.

7. The semiconductor device as claimed in claim 1, further comprising:
a sidewall insulating film selectively covering the side face of said capacitor element,
wherein said second contact plug is provided as being brought into contact with said sidewall insulating film.

8. The semiconductor device as claimed in claim 1, further comprising an insulating film provided selectively on the side face and over said capacitor element, so as to cover said capacitor element from the side face and the top surface thereof.

9. The semiconductor device as claimed in claim 1, containing a plurality of said capacitor elements, said upper electrodes of said plurality of capacitor elements being provided while being continuously integrated to form a band.

10. The semiconductor device as claimed in claim 1, wherein said first region composes a memory section, and said second region composes a logic section.

11. The semiconductor device according to claim 1, said upper electrode is in correspondence to a single said lower electrode.

12. A semiconductor device comprising:
a capacitor element comprising a flat-plate-type lower electrode provided over a semiconductor substrate, a flat-plate-type upper electrode provided over said lower electrode in parallel therewith, and a capacitor film provided between said lower electrode and said upper electrode; and
a first contact plug brought into contact with the bottom surface of said lower electrode, and is composed of a metal material,
wherein said capacitor film has a film which contains an organic molecule as a constituent,
wherein said upper electrode comprises a first and second layer,
wherein a planar geometry of said upper electrode equals a planar geometry of said capacitor film,
said planar geometry of said upper electrode is greater than the planar geometry of said lower electrode.

13. The semiconductor device according to claim 12, wherein each of said upper electrode, said lower electrode and said capacitor film are centered over said first contact plug.

* * * * *